United States Patent
Parikh et al.

(10) Patent No.: US 7,458,058 B2
(45) Date of Patent: Nov. 25, 2008

(54) VERIFYING A PROCESS MARGIN OF A MASK PATTERN USING INTERMEDIATE STAGE MODELS

(75) Inventors: Ashesh Parikh, Frisco, TX (US);
William R. McKee, Lucas, TX (US);
Thomas J. Aton, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 676 days.

(21) Appl. No.: 11/150,613

(22) Filed: Jun. 10, 2005

(65) Prior Publication Data

US 2006/0281015 A1      Dec. 14, 2006

(51) Int. Cl.
G06F 17/50 (2006.01)
G06F 19/00 (2006.01)
G21K 5/00 (2006.01)
G03F 1/00 (2006.01)

(52) U.S. Cl. .............. 716/21; 716/9; 716/10; 700/97; 700/120; 700/121; 430/5; 378/35

(58) Field of Classification Search ......... 716/9, 716/10, 21; 700/97, 120, 121; 430/5; 378/35
See application file for complete search history.

(56) References Cited

U.S. PATENT DOCUMENTS

| | | | | |
|---|---|---|---|---|
| 5,539,652 A * | 7/1996 | Tegethoff | ............... | 703/14 |
| 5,879,844 A * | 3/1999 | Yamamoto et al. | ............... | 430/30 |
| 6,077,310 A * | 6/2000 | Yamamoto et al. | ............... | 716/19 |
| 6,756,168 B2 * | 6/2004 | Yu et al. | ............... | 430/30 |
| 6,813,757 B2 | 11/2004 | Aton et al. | | |
| 6,876,894 B1 * | 4/2005 | Chen et al. | ............... | 700/100 |
| 6,934,671 B2 * | 8/2005 | Bertsch et al. | ............... | 703/14 |
| 6,977,517 B2 * | 12/2005 | Miao et al. | ............... | 324/767 |
| 7,019,548 B2 * | 3/2006 | Miao et al. | ............... | 324/767 |
| 7,194,325 B2 * | 3/2007 | Lee et al. | ............... | 700/108 |
| 7,243,316 B2 * | 7/2007 | White et al. | ............... | 716/4 |
| 7,363,099 B2 * | 4/2008 | Smith et al. | ............... | 700/121 |

(Continued)

FOREIGN PATENT DOCUMENTS

JP       2004061720 A    *    2/2004

OTHER PUBLICATIONS

Erhardt et al., "A Defect-toYield Correlation Study for Marginally Printing Reticle Defects in the Manufacture of a 16 Mb Flash Memory Device", 2000 IEEE/SEMI Advanced Semiconductor Manufacturing Conference and Workshop, Sep. 12-14, 2000, pp. 96-102.*

(Continued)

*Primary Examiner*—Phallaka Kik
(74) *Attorney, Agent, or Firm*—Wade J. Brady, III; Frederick J. Telecky, Jr.

(57) ABSTRACT

Verifying a process margin for a mask pattern includes receiving the mask pattern for patterning features on a semiconductor wafer. The mask pattern is modified according to a wafer pattern model operable to estimate a wafer pattern resulting from the mask pattern. An intermediate stage model is selected to apply to a portion of the mask pattern, where the intermediate stage model is operable to estimate an intermediate stage of the wafer pattern. A process margin of the portion is verified by selecting a test of the intermediate stage model, and performing the test on the portion to verify the process margin of the portion.

18 Claims, 2 Drawing Sheets

U.S. PATENT DOCUMENTS

| | | | | |
|---|---|---|---|---|
| 7,367,008 | B2* | 4/2008 | White et al. | 716/19 |
| 7,383,521 | B2* | 6/2008 | Smith et al. | 716/6 |
| 7,395,132 | B2* | 7/2008 | Prager et al. | 700/108 |
| 7,398,508 | B2* | 7/2008 | Shi et al. | 716/19 |
| 2003/0036270 | A1* | 2/2003 | Yu et al. | 438/689 |
| 2003/0229410 | A1* | 12/2003 | Smith et al. | 700/109 |
| 2004/0023422 | A1* | 2/2004 | Miao et al. | 438/17 |
| 2005/0112997 | A1* | 5/2005 | Lin et al. | 451/5 |
| 2005/0132306 | A1* | 6/2005 | Smith et al. | 716/1 |
| 2005/0159835 | A1* | 7/2005 | Yamada et al. | 700/109 |
| 2005/0172251 | A1* | 8/2005 | Change et al. | 716/6 |
| 2005/0218925 | A1* | 10/2005 | Miao et al. | 324/767 |
| 2005/0251771 | A1* | 11/2005 | Robles | 716/5 |
| 2005/0256601 | A1* | 11/2005 | Lee et al. | 700/108 |
| 2006/0150129 | A1* | 7/2006 | Chiu et al. | 716/4 |
| 2006/0206853 | A1* | 9/2006 | Kamo et al. | 716/19 |
| 2006/0236297 | A1* | 10/2006 | Melvin et al. | 716/21 |
| 2006/0266243 | A1* | 11/2006 | Percin et al. | 101/484 |
| 2008/0216027 | A1* | 9/2008 | White et al. | 716/4 |
| 2008/0228306 | A1* | 9/2008 | Yetter et al. | 700/109 |

OTHER PUBLICATIONS

Qian et al., "Advanced Physical Models for Mask Data Verification and Impacts on Physical Layout Synthesis", Proceedings of Fourth International Symposium on Quality Electronic Design, Mar. 24-26, 2003, pp. 125-130.*

Stine et al., "Rapid Characterization and Modeling of Pattern-Dependent Variation Chemical-Mechanical Polishing", IEEE Transactions on Semiconductor Manufacturing, vol. 11, No. 1, Feb. 1998, pp. 129-140.*

UMC and Synopsys Develop Reference Flow for UMC's Advanced Deep Submicron Processes, Collaboration Validates Synopsys' Galaxy Design Platform for UMC's 0.13 micron Process, Synopsys, Inc., Corporate, Copyright © 2005 Synopsys, Inc., http://www.synopsys.com, 2 pages, May 3, 2004.

TSMC and Synopsys Address Design Challenges for 90 Nanometer and Below with TSMC Reference Flow 5.0, Synopsys, Inc., Corporate, Copyright © 2005 Synopsys, Inc., http://www.synopsys.com, 3 pages, Jun. 7, 2004.

Hercules Physical Verification Suite (PVS) The Industry's Fastest Physical Verification Solution, Synopsys, Inc., Products & Solutions, Copyright © 2005 Synopsys, Inc., http://www.synopsys.com, 4 pages, Jan. 6, 2005.

* cited by examiner

VERIFYING A PROCESS MARGIN OF A MASK PATTERN USING INTERMEDIATE STAGE MODELS

TECHNICAL FIELD

This invention relates generally to the field of photolithography and more specifically to verifying a process margin of a mask pattern using intermediate stage models.

BACKGROUND

Photomasks may be used in photolithographic systems to define patterns on semiconductor wafers in order to manufacture integrated circuits. Processing situations, however, may distort the resulting pattern defined on the wafer. For example, optical diffraction may cause the pattern defined on a wafer to differ from the pattern of the mask.

A mask pattern may be modified to compensate for these deviations. According to a known technique, an etch model may be used to modify a mask pattern. For a specific mask pattern, an etch model may be used to estimate the resulting pattern defined on the wafer after the etching process. The mask pattern may be modified in accordance with the estimate. According to another known technique, a rule-based table may be used to correct a mask pattern. A rule-based table includes rules that a mask pattern may be required to satisfy. The mask pattern may be modified to satisfy the rules. These known techniques, however, may yield unsatisfactory results in certain situations. It is generally desirable to have satisfactory results.

SUMMARY OF THE DISCLOSURE

In accordance with the present invention, disadvantages and problems associated with previous techniques for verifying process margins may be reduced or eliminated.

According to one embodiment of the present invention, verifying a process margin for a mask pattern includes receiving the mask pattern for patterning features on a semiconductor wafer. The mask pattern is modified according to a wafer pattern model operable to estimate a wafer pattern resulting from the mask pattern. An intermediate stage model is selected to apply to a portion of the mask pattern, where the intermediate stage model is operable to estimate an intermediate stage of the wafer pattern. A process margin of the portion is verified by selecting a test of the intermediate stage model, and performing the test on the portion to verify the process margin of the portion.

Certain embodiments of the invention may provide one or more technical advantages. A technical advantage of one embodiment may be that a mask pattern may be modified according a first model, and then the process margin for the mask pattern may be verified according to a second model. Verifying the process margin using a different model may allow for more accurate verification. Another technical advantage of one embodiment may be that the first model may be an etch model, and the second model may be a resist model. Verifying the process margin using a resist model may yield more effective verification of resist distortions.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Embodiments of the present invention and its advantages are best understood by referring to FIGS. 1 through 4 of the drawings, like numerals being used for like and corresponding parts of the various drawings.

Figure 1:
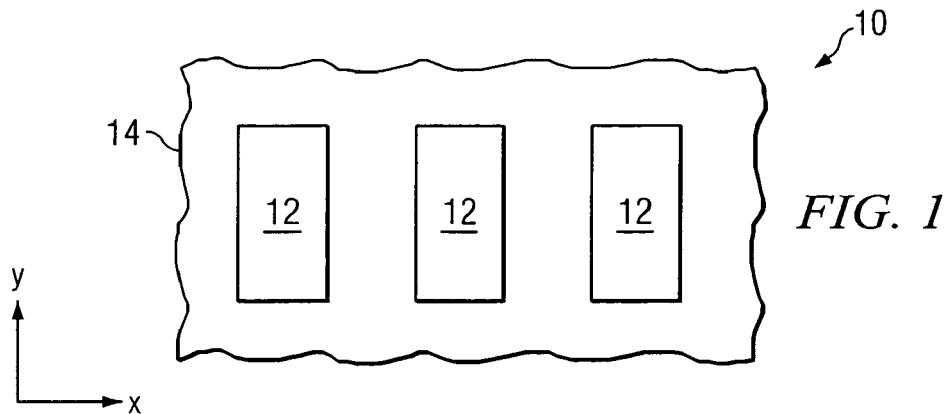
FIG. 1 is a diagram illustrating a first view of an example mask with a mask pattern that may be verified according to one embodiment of the invention.
Figure 2:
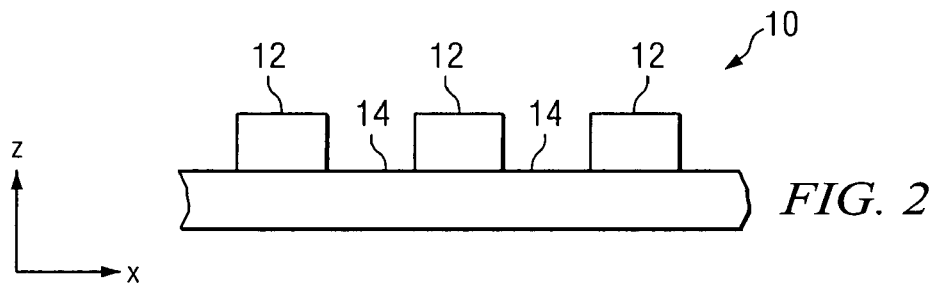
FIG. 2 is a diagram illustrating a second view of the example mask of FIG. 1.

FIGS. 1 and 2 are diagrams illustrating views of an example mask with a mask pattern that may be verified according to one embodiment of the invention. According to the embodiment, the mask pattern may be modified according a first model, and then the process margin for the mask pattern may be verified according to a second model. Verifying the process margin using a different model may allow for more accurate verification. The first model may be an etch model, and the second model may be a resist model. Verifying the process margin using a resist model may yield more effective verification of distortions of the photoresist layer.

A mask may refer to a photomask used in a photolithographic system to define a pattern on an object. For example, a mask may be used to define a pattern on a semiconductor wafer to form an integrated circuit. Typically, a mask is placed between a light source and an object. A mask has a mask pattern that selectively blocks, transmits, or otherwise modifies light to define a pattern on the object.

A mask comprises features placed on a background. A clear field mask has a clear background on which opaque features are defined. An opaque feature may refer to a feature that substantially blocks light from passing through an otherwise transparent mask. A dark field mask has an opaque background on which clear features are defined. A clear feature may refer to a feature that substantially transmits light through an otherwise opaque mask.

Clear regions may comprise any suitable substantially transparent material operable to substantially transmit light. For example, clear regions may comprise glass, film, other suitable clear material, or any combination of the preceding. Opaque regions may comprise any suitable substantially opaque material operable to substantially block light. For example, opaque regions may comprise silver, chrome, chrome oxide, iron oxide, copper, aluminum, silicon oxide, molybdenum silicon, other suitable opaque or partially transmissive material, or any combination of the preceding.

According to one embodiment, a mask may be used to define a wafer pattern on a semiconductor wafer to make an integrated circuit. During the initial stages of processing, a photoresist layer is deposited outwardly from the outer surface of the wafer. A photoresist layer comprises a material that reacts to light.

During the intermediate stages, the photoresist layer may be exposed, etched, or subject to other processing. An intermediate stage may refer to exposing, etching, or other processing of the photoresist layer, or any combination of the preceding. During exposure, a mask is positioned between a light source and the wafer. The mask selectively blocks, transmits, or otherwise modifies light to expose parts of the photoresist layer. The exposure yields changes in the properties of the photoresist material such that the exposed material becomes soluble or insoluble in a solvent solution. During development, the solvent solution that includes chemical solvents either removes or leaves behind the exposed regions of the photoresist material, while the unexposed photoresist material remains or is removed. After the intermediate stages, a pattern on the semiconductor wafer is defined on the wafer by etching or other means of transfer of the resist pattern to or into the wafer surface. Post-processing stages may include, for example, shrinking or flowing the resist or polymer film or both the resist and polymer films.

An intermediate stage model describes the wafer during an intermediate stage, and may be used to estimate a response of the photoresist layer at an intermediate stage. As an example, a typical resist model may describe the photoresist layer of the wafer following development. As another example, an etch model may describe the wafer pattern after etching. A wafer pattern model describes the final pattern defined on the wafer, and may be used to predict the final pattern defined on the wafer given a specific mask pattern. Typical wafer pattern models may include optical proximity correction models that compensate for distortions resulting from optical diffraction.

According to the illustrated embodiment, the pattern of example mask 10 may be verified using an intermediate stage model. Mask 10 includes features 12 and background regions 14. A feature may refer to an opaque feature of a mask that substantially prevents light from reaching the wafer. Feature 12 may represent an opaque feature such as a gate of a transistor, an interconnect region such as a metal interconnect, a contact, a via, an active region, or a hole pattern. Background regions 14 may represent clear regions through which light may pass.

In the illustrated example, the transverse axis of each feature 12 is substantially parallel to an x-axis, the longitudinal axis of each feature 12 is substantially parallel to an y-axis, and height axis of each feature 12 is substantially parallel to a z-axis. Pitch refers to distance between features 12 in the x-direction. Run length refers to the length of a feature 12 in the y-direction.

A contrast ratio may be defined as a peak-to-valley intensity ratio. The peak intensity may refer to the maximum light intensity received at the wafer, and valley intensity may refer to the minimum light intensity at the wafer. Typically, the peaks occur at portions of the wafer patterned by background regions 14, and the valleys occur at portions of the wafer patterned by features 12. Typically, a photoresist may respond satisfactorily above a minimum contrast ratio. That is, a typical photoresist may require a contrast ratio above a contrast ratio threshold value, such as a minimum value, in order to be effectively developed.

Certain aspects of features 12 and background regions 14 may affect the contrast ratio. For example, as the pitch between features 12 decreases, the contrast ratio decreases. As another example, as the run length of a feature 12 decreases, the contrast ratio decreases. As another example, as the height of a feature 12 decreases, the contrast ratio decreases.

The process margin of a mask pattern may be verified using the contrast ratio to estimate whether the pattern yields a satisfactory wafer pattern. Process margin refers to the range of exposure dose and defocus over which acceptable image size robustness can be maintained. According to one embodiment, the process margin may be verified according to an intermediate stage model. Verifying the process margin using an intermediate stage model may take into account distortions that occur during the intermediate stages, which may yield more accurate verification.

Example mask 10 is presented as an example only. Modifications, additions, or omissions may be made to mask 10 without departing from the scope of the invention. Mask 10 may include more, fewer, or other features. Additionally, the features may be arranged in any suitable manner without departing from the scope of the invention.

Figure 3:
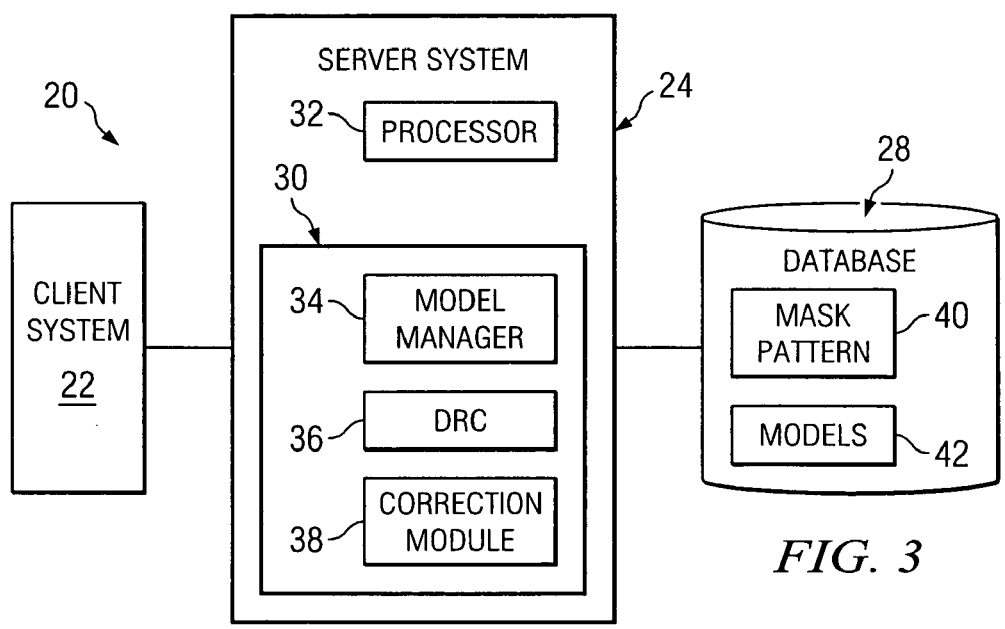
FIG. 3 is a block diagram illustrating one embodiment of a system operable to verify a mask pattern.

FIG. 3 is a block diagram illustrating one embodiment of a system 20 operable to verify a mask pattern. According to the embodiment, system 20 may correct the mask pattern according a first model, and then verify the process margin according to a second model. The first model may be an etch model, and the second model may be a resist model.

According to the illustrated embodiment, system 20 includes a client system 22, a server system 24, and a database 28 coupled as shown. According to one embodiment, client system 22 allows a user to communicate with server system 24 to execute applications that may be used to verify mask patterns. Client system 22 may include any hardware, software, other logic, or any combination of the preceding for communicating with server system 24, and may use any of a variety of computing structures, arrangements, and compilations to communicate with server system 24.

Server system 24 manages applications 30 that may be used to verify mask patterns. Server system 24 may include any hardware, software, other logic, or any combination of the preceding for managing applications 30, and may use any of a variety of computing structures, arrangements, and compilations to manage applications 30. According to the illustrated embodiment, server system 24 includes a processor 32 operable to execute one or more applications 30.

According to the illustrated embodiment, applications 30 include a model manager 34, a design rule checker (DRC) 36, and a correction module 38. Model manager 34 identifies a model to use to verify the process margin of a mask pattern. Model manager 34 may also identify tests of the model to perform on the mask pattern, and performs the tests. Model manager 34 may use any suitable method of operation. An example method is described in more detail with reference to FIG. 4.

Design rule checker 36 applies a set of design rules to a mask pattern and identifies features that violate the applied rules. A design rule may refer to a requirement for a mask pattern to yield satisfactory pattern on a wafer. The rule may pose a geometric requirement. As an example, a rule may define a minimum spacing value between two features. As another example, a rule may define a minimum width value for a feature. According to one embodiment, model manager 34 may utilize design rule checker 36 to perform tests on a mask pattern. The tests, however, may be performed in any suitable manner.

Correction module 38 may adjust a mask pattern to compensate for deviations that may occur during the manufacturing process of an integrated circuit. Deviations may result from, for example, optical diffraction, etch effects, mask-making effects, resist effects, or other effects occurring during the manufacturing process. According to one embodiment, correction module 38 may be used to perform initial correction of a mask pattern. The initial correction of s mask pattern, however, may be performed in any suitable manner. Correction module 38 may also be used to correct a mask pattern in response to instructions from model manager 34.

Database 28 may include any hardware, software, other logic, or combination of the preceding for storing and facilitating retrieval of information used by server system 24. Also, database 28 may use any of a variety of data structures, arrangements, and compilations to store and facilitate retrieval of information used by server system 24.

According to the illustrated embodiment, database 28 stores a mask pattern 40 and one or more models 42. Mask pattern 40 may represent a pattern for a photolithographic mask for patterning a wafer to produce an integrated circuit. Mask pattern 40 may include main features 12 and background regions 14. Mask pattern 40 may undergo proximity correction processing to compensate for distortions before or after or both before and after models are applied.

Models 42 may include intermediate stage models. Examples of intermediate stage models includes resist models, out-of-focus models, underlying layer models, mask mispatterning models, and multiple exposure models. A resist model models the response of the photoresist layer to exposure, development, bake, or other processes, and may comprise a calibrated lithography model. A resist model may be used to test whether the contrast ratio for features of a mask pattern can yield effective exposure of the photoresist layer. For example, the model may be used to calculate peak-to-valley ratios of the pattern, and determine whether the ratios satisfy a contrast ratio threshold for the photoresist layer.

A resist model may include resist model tests. A test may comprise a condition that invokes a response if a threshold is satisfied. A condition may be stated as a relationship between a computed value and a threshold value. Example conditions may include a peak-to-valley ratio greater than a minimum threshold, a peak value greater than a minimum peak threshold, a slope value greater than a minimum slope threshold, and a width greater than a minimum width threshold.

Other conditions may include geometric aspects of features 12. Example conditions may include a length greater than a maximum value or less than a minimum value. A response may refer to an action that is taken in response to a condition. For example, the condition invoking the response may be recorded. As an example, the features that are greater than the maximum value or less than the minimum value may be recorded.

The resist model may also be used to test the robustness of a pattern to deviations in the photoresist layer. Robustness of a pattern may refer to the ability of the pattern to yield a satisfactory wafer pattern even if deviations are present. Certain features may require increased robustness. For example, a feature with a critical dimension such as a gate may require increased robustness. A test may be performed to determine if a wafer pattern of a mask pattern remains sufficiently constant, given deviations of the photoresist layer.

An out-of-focus model may be used to test the robustness of mask pattern 40 in response to the focus of the light during the resist process, the etch process, or any other suitable process. Parts of the wafer may be out-of-focus. For example, the wafer may not be perfectly flat, may be tilted with respect to the lens, or may have some other aspect such that parts of the wafer are out of focus. The out-of-focus model tests whether a portion of the pattern 40 can effectively pattern a part the wafer if the part is out-of-focus.

An underlying layer model may be used to test whether a layer is affected by another layer. For example, whether a gate layer is affected by a diffusion layer or whether a patterned layer is affected by an underlying layer.

A mask mispatterning model may test the robustness of a pattern in response to mask mispatterning. Mask mispatterning may refer to deviations between the actual mask and the desired mask pattern. Mask mispatterning may be described by mask error enhancement factors (MEEF).

A multiple exposure model may be used to test the robustness of a pattern formed by multiple exposures. In multiple exposure processes, a wafer or the resist on a wafer may be patterned with a first mask and then patterned with a second mask. Typically the pattern formed by the first mask is expected to be aligned with the pattern formed by the second mask. Practically, however, the patterns on the wafer may be misaligned. A multiple exposure model may be used to test the robustness of the mask patterns to misalignment.

Client system 22, server system 24, and database 28 may operate on one or more computers, and may include appropriate input devices, output devices, storage media, processors, memory, or other components for receiving, processing, storing, and communicating information according to the operation of system 20. For example, the functions of client system 22, server system 24, database 28, or any combination of the preceding may be provided using a single computer system, for example, a personal computer. As used in this document, the term "computer" refers to any suitable device operable to execute instructions and manipulate data to perform operations, for example, a personal computer, work station, network computer, wireless telephone, personal digital assistant, one or more microprocessors within these or other devices, or any other suitable processing device.

Modifications, additions, or omissions may be made to system 20 without departing from the scope of the invention. For example, client system 22, server system 24, and database 28 may be integrated or separated according to particular needs. If any of client system 22, server system 24, and database 28 are separated, the separated components may be coupled to each other using a local area network (LAN), a metropolitan area network (MAN), a wide area network (WAN), a global computer network such as the Internet, or any other appropriate wire line, wireless, or other link.

Moreover, the operations of system 20 may be performed by more, fewer, or other modules. For example, the operations of model manager 34 and correction module 38 may be performed by one module, or the operations of model manager 34 may be performed by more than one module. Additionally, operations of system 10 may be performed using any suitable logic comprising software, hardware, other logic, or any suitable combination of the preceding. As used in this document, "each" refers to each member of a set or each member of a subset of a set.

Figure 4:
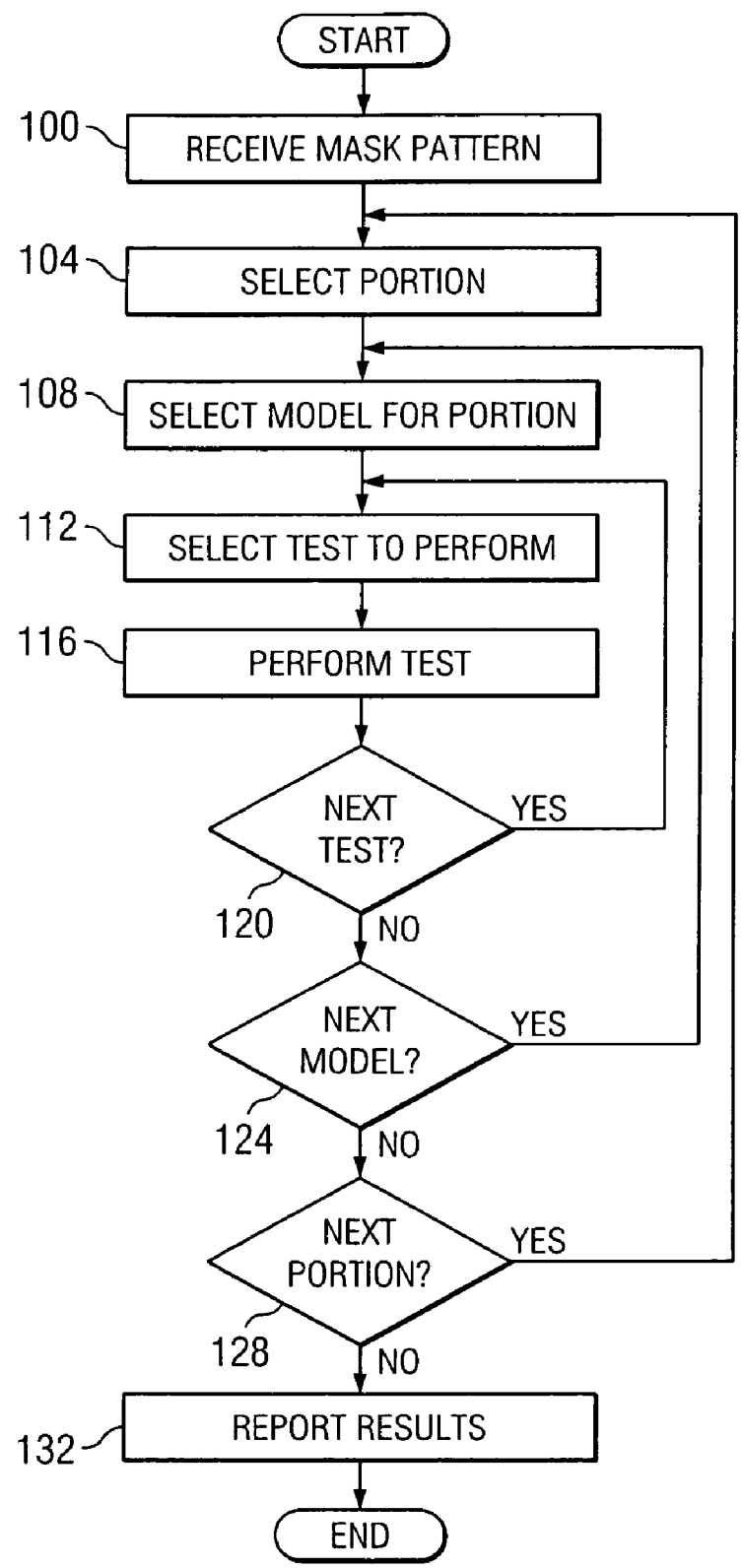
FIG. 4 is a flowchart illustrating one embodiment of a method operable to verify a mask pattern that may be used by the system of FIG. 3.

FIG. 4 is a flowchart illustrating one embodiment of a method operable to verify a mask pattern that may be used by system 10 of FIG. 3. The method begins at step 100, where a mask pattern is received. The mask pattern may be for a mask that includes features. According to one embodiment, the mask pattern may have been subject to a suitable proximity correction process. The mask pattern, however, need not have been subject to any correction process. A portion is selected to be verified at step 104. A portion may be selected in accordance with the features of the portion. For example, portions with features having critical dimensions may be selected.

Steps 108 through 124 describe an iteration of selecting a model and performing tests of the model. An iteration may occur at any suitable stage of the connection process, and subsequent iterations may be used to select the same or different types of models. As an example, each iteration may be performed to select the same type of model, such as a resist model. As another example, an iteration may be performed to select an etch model, and a next iteration may be performed to select a resist model.

A model to be applied to the portion is selected at step 108. According to one embodiment, the model may be selected according to the local geometry of the features of the portion. For example, an etch model may be selected to check segment connections, and a resist model may be selected to check hole openings or line continuity. According to another embodiment, the model may be selected according to the results of a previous iteration. As an example, a previous model may have identified a particular problem at the portion during a previous iteration. The current model may be selected to address the identified problem. As another example, a model may be selected to determine whether corrections for a current subsequent model would work. According to yet another embodiment, the model may be selected according to available computational time. Certain models may take more time than available.

The model includes tests that may be performed at the portion. A test may include a condition that invokes a response. A test is selected at step 112. The test may be selected according to local geometry, a previous result, available computational time, or other suitable criteria. The selected test is performed at step 116 to verify the process margin. If there is a next test at step 120, the method returns to step 112 to select the next test. If there is no next test, the method proceeds to step 124. If there is a next model at step 124, the method returns to step 108, where the next model is selected. If there is no next model, the method proceeds to step 128.

If there is a next portion to verify, the method returns to step 104 to select the next portion. If there is no next portion, the method proceeds to step 132. At step 132, the results are reported. The results may be used to modify the mask pattern to compensate for distortion resulting from the intermediate stages. The results may also be used to modify the circuit design.

Modifications, additions, or omissions may be made to the method without departing from the scope of the invention. The method may include more, fewer, or other steps. Additionally, steps may be performed in any suitable order without departing from the scope of the invention.

Certain embodiments of the invention may provide one or more technical advantages. A technical advantage of one embodiment may be that a mask pattern may be modified according a first model, and then the process margin for the mask pattern may be verified according to a second model. Verifying the process margin using a different model may allow for more accurate verification. Another technical advantage of one embodiment may be that the first model may be an etch model, and the second model may be a resist model. Verifying the process margin using a resist model may yield more effective verification of resist distortions.

While this disclosure has been described in terms of certain embodiments and generally associated methods, alterations and permutations of the embodiments and methods will be apparent to those skilled in the art. Accordingly, the above description of example embodiments does not constrain this disclosure. Other changes, substitutions, and alterations are also possible without departing from the spirit and scope of this disclosure, as defined by the following claims.

What is claimed is:

1. A method for verifying a process margin for a mask pattern, comprising:
   receiving a mask pattern for patterning one or more features associated with a semiconductor wafer, the mask pattern modified according to a wafer pattern model, the wafer pattern model operable to estimate a wafer pattern resulting from the mask pattern, the mask pattern comprising one or more portions; and
   repeating the following for each portion of the one or more portions of the mask pattern:
      selecting a plurality of intermediate stage models to apply to the portion, an intermediate stage model operable to estimate an intermediate stage of the wafer pattern; and
      verifying a process margin of the portion by repeating the following for each intermediate stage model of the plurality of intermediate stage models:
         selecting one or more tests of the intermediate stage model to perform on the portion; and
         performing the one or more tests on the portion to verify the process margin,
   wherein selecting the plurality of intermediate stage models further comprises:
      selecting and applying a first intermediate stage model;
      establishing a previous result from a previously applied first intermediate stage model; and
      selecting a second intermediate stage model based on the previous result.

2. The method of claim 1, wherein:
   the wafer pattern model comprises an etch model, the etch model describing the wafer pattern resulting from an etch process.

3. The method of claim 1, wherein:
   an intermediate stage model comprises a resist model, the resist model describing a response of a photoresist layer to the mask pattern.

4. The method of claim 1, wherein verifying the process margin of the portion further comprises:
   estimating a contrast ratio of a feature of the portion; and
   establishing whether the contrast ratio satisfies a photoresist contrast ratio threshold.

5. The method of claim 1, wherein verifying the process margin of the portion further comprises:
   determining whether a contrast ratio of a feature of the portion satisfies a photoresist contrast ratio threshold; and
   verifying the process margin in accordance with the determination.

6. The method of claim 1, wherein selecting the plurality of intermediate stage models further comprises:
   establishing a local geometry of a feature of the portion; and
   selecting an intermediate stage model in accordance with the local geometry.

7. The method of claim 1, wherein selecting the plurality of intermediate stage models further comprises:
   establishing available computational time to verify the mask pattern, the available computational time representing computational time available to verify the mask pattern; and
   selecting an intermediate stage model in accordance with the available computational time.

8. The method of claim 1, wherein performing the one or more tests on the portion to verify the process margin further comprises:
   performing a test to determine the ability of the portion to yield a satisfactory wafer pattern if one or more deviations are present; and
   estimating a robustness for the portion in accordance with a result of the test.

9. A computer readable medium containing program code that configures a computer to perform a method for verifying a process margin for a mask pattern, comprising:

program code for receiving a mask pattern for patterning one or more features associated with a semiconductor wafer, the mask pattern modified according to a wafer pattern model, the wafer pattern model operable to estimate a wafer pattern resulting from the mask pattern, the mask pattern comprising one or more portions; and program code for repeating the following for each portion of the one or more portions of the mask pattern:
  selecting a plurality of intermediate stage models to apply to the portion, an intermediate stage model operable to estimate an intermediate stage of the wafer pattern; and
  verifying process margin of the portion by repeating the following for each intermediate stage model of the plurality of intermediate stage models:
    selecting one or more tests of the intermediate stage model to perform on the portion; and
    performing the one or more tests on the portion to verify the process margin, wherein selecting the plurality of intermediate stage models further comprises:
  selecting and applying a first intermediate stage model;
  establishing a previous result from a previously applied first intermediate stage model; and
  selecting a second intermediate stage model based on the previous result.

10. The computer readable medium of claim 9, wherein: the wafer pattern model comprises an etch model, the etch model describing the wafer pattern resulting from an etch process.

11. The computer readable medium of claim 9, wherein: an intermediate stage model comprises a resist model, the resist model describing a response of a photoresist layer to the mask pattern.

12. The computer readable medium of claim 9, wherein verifying the process margin of the portion further comprises:
  estimating a contrast ratio of a feature of the portion; and
  establishing whether the contrast ratio satisfies a photoresist contrast ratio threshold.

13. The computer readable medium of claim 9, wherein verifying the process margin of the portion further comprises:
  determining whether a contrast ratio of a feature of the portion satisfies a photoresist contrast ratio threshold; and
  verifying the process margin in accordance with the determination.

14. The computer readable medium of claim 9, wherein selecting the plurality of intermediate stage models further comprises:
  establishing a local geometry of a feature of the portion; and
  selecting an intermediate stage model in accordance with the local geometry.

15. The computer readable medium of claim 9, wherein selecting the plurality of intermediate stage models further comprises:
  establishing available computational time to verify the mask pattern, the available computational time representing computational time available to verify the mask pattern; and
  selecting an intermediate stage model in accordance with the available computational time.

16. The computer readable medium of claim 9, wherein performing the one or more tests on the portion to verify the process margin further comprises:

performing a test to determine the ability of the portion to yield a satisfactory wafer pattern if one or more deviations are present; and
estimating a robustness for the portion in accordance with a result of the test.

17. A system for verifying a process margin for a mask pattern, comprising:
  means for receiving a mask pattern for patterning one or more features associated with a semiconductor wafer, the mask pattern modified according to a wafer pattern model, the wafer pattern model operable to estimate a wafer pattern resulting from the mask pattern, the mask pattern comprising one or more portions; and
  means for repeating the following for each portion of the one or more portions of the mask pattern:
    selecting a plurality of intermediate stage models to apply to the portion, an intermediate stage model operable to estimate an intermediate stage of the wafer pattern; and
    verifying a process margin of the portion by repeating the following for each intermediate stage model of the plurality of intermediate stage models:
      selecting one or more tests of the intermediate stage model to perform on the portion; and
      performing the one or more tests on the portion to verify the process margin,
  wherein selecting the plurality of intermediate stage models further comprises:
    selecting and applying a first intermediate stage model;
    establishing a previous result from a previously applied first intermediate stage model; and
    selecting a second intermediate stage model based on the previous result.

18. A method for verifying a process margin for a mask pattern, comprising:
  receiving a mask pattern for patterning one or more features associated with a semiconductor wafer, the mask pattern modified according to a wafer pattern model, the wafer pattern model operable to estimate a wafer pattern resulting from the mask pattern, the wafer pattern model comprising an etch model, the etch model describing the wafer pattern resulting from an etch process, the mask pattern comprising one or more portions; and
  repeating the following for each portion of the one or more portions of the mask pattern:
    selecting a plurality of intermediate stage models to apply to a portion, wherein an intermediate stage model is operable to estimate an intermediate stage of the wafer pattern and comprises a resist model that describes a response of a photoresist layer to the mask pattern;
    selecting the plurality of intermediate stage models further comprising:
      establishing a local geometry of a feature of the portion;
      selecting a first intermediate stage model in accordance with the local geometry;
      establishing a previous result from a previously applied first intermediate stage model;
      selecting a second intermediate stage model in accordance with the previous result;
      establishing available computational time to verify the mask pattern, the available computational time representing computational time available to verify the mask pattern; and
      selecting a third intermediate stage model in accordance with the available computational time; and verifying a process margin of the portion by repeating the following for each intermediate stage model of the plurality of intermediate stage models:
  selecting one or more tests of the intermediate stage model to perform on the portion; and
  performing the one or more tests on the portion to verify the process margin, performing the one or more tests on the portion to verify the process margin further comprising:
    performing a test to determine the ability of the portion to yield a satisfactory wafer pattern if one or more deviations are present; and
    estimating a robustness for the portion in accordance with a result of the test;
verifying the process margin of the portion further comprising:
  estimating a contrast ratio of a feature of the portion;
  determining whether the contrast ratio satisfies a photoresist contrast ratio threshold; and
  verifying the process margin in accordance with the contrast ratio threshold satisfaction determination.

* * * * *